United States Patent [19]

Schwee et al.

[11] 4,192,012
[45] Mar. 4, 1980

[54] CROSSTIE MEMORY BIT STRETCHER DETECTOR

[75] Inventors: Leonard J. Schwee, Colesville; Wallace E. Anderson, Beltsville; Yuan-Jye Liu, Rockville; Ronald N. Lee, Silver Spring, all of Md.

[73] Assignee: The United States of America as represented by the Secretary of the Navy, Washington, D.C.

[21] Appl. No.: 958,913

[22] Filed: Nov. 8, 1978

[51] Int. Cl.$^2$ ............................................. G11C 19/08
[52] U.S. Cl. ........................................ 365/87; 365/172
[58] Field of Search ........................ 365/87, 171–172, 365/8, 43, 158

[56] References Cited
U.S. PATENT DOCUMENTS 4,100,609  7/1978  Schwee et al. .................. 365/87

OTHER PUBLICATIONS

IEEE Transactions on Magnetics-vol. Mag.-12, No. 6; Nov. 1976, pp. 608-613.

*Primary Examiner*—James W. Moffitt
*Attorney, Agent, or Firm*—R. S. Sciascia; A. L. Branning; R. E. Bushnell

[57] ABSTRACT

A magnetoresistance detector linearly stretching single bits of binary information such as those represented by Bloch line - crosstie pairs, along the major dimension of a thin magnetic film strip such as a serriform crosstie memory. The detector circuit is overlaid upon the thin magnetic film strip. In a selected area, less pronounced serrations in the adjacent margins, in conjunction with a magnetic field created by current through the detector circuit enable Bloch lines entering the area to travel farther. A series of oriented open segments in the overlain section of the detector circuit, arranged in symmetric correspondence with serrations in the adjacent margins, enhances the difference between logical zero and one signals in the detector circuit.

6 Claims, 19 Drawing Figures

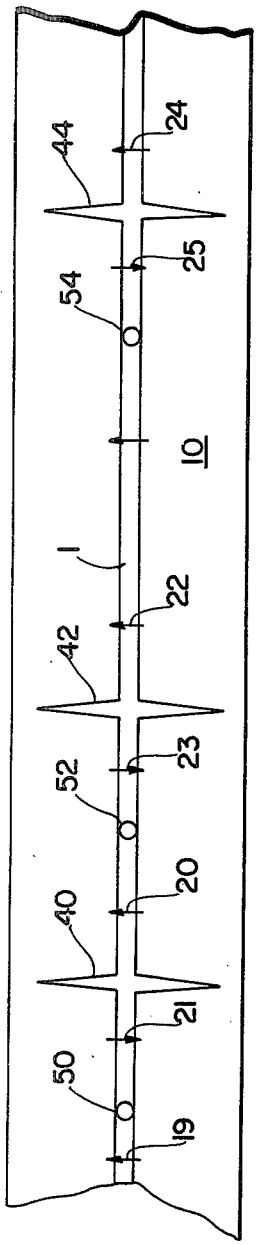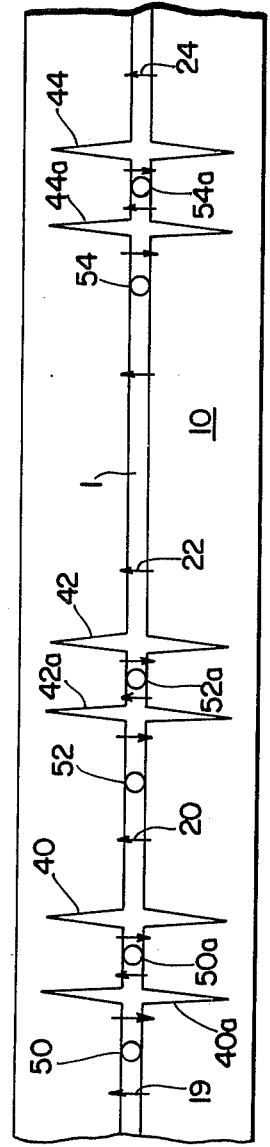
PRIOR ART
FIG. 6A
PRIOR ART
FIG. 6B

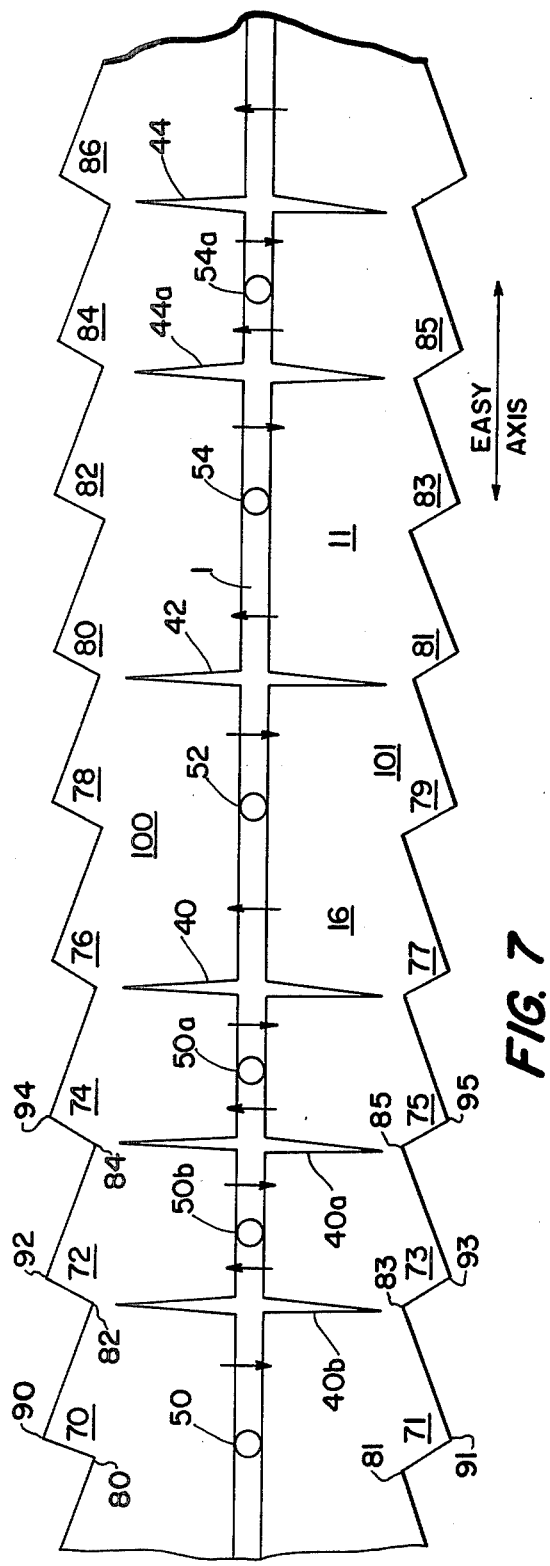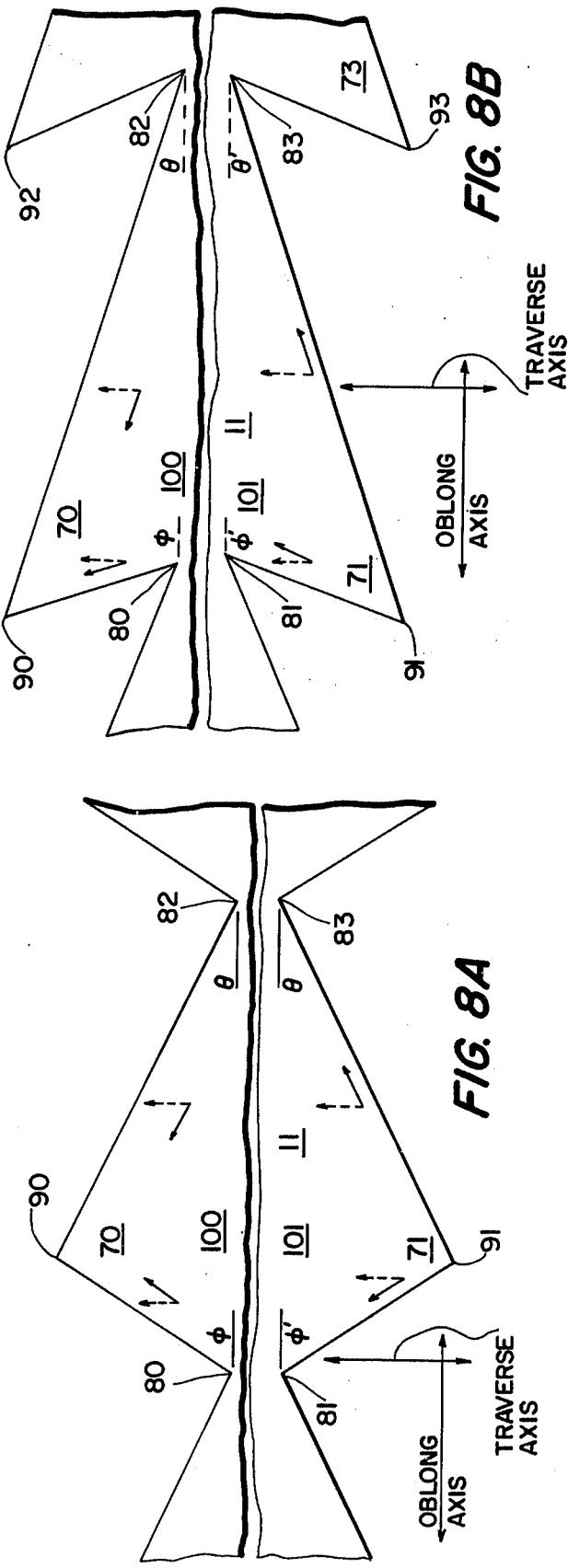
FIG. 7
FIG. 8A
FIG. 8B

CROSSTIE MEMORY BIT STRETCHER DETECTOR

BACKGROUND OF THE INVENTION

This invention relates to the art of shift registers and more particularly, to magnetoresistance circuits and processes for sensing magnetic field patterns on thin magnetic film memories.

Prior art thin magnetic film memory devices rely upon detection of the modulation of a high frequency electromagnetic wave by ferromagnetic resonance absorption, e.g., U.S. Pat. No. 3,629,520, or detection of domain wall creep in response to application of a local magnetic field, e.g. U.S. Pat. No. 3,868,660. The bit density and the suitability for multi-unit fabrication of thin magnetic film strip memories available through the teachings of recent disclosures in the thin-film memory art and such novel features as the stable domain wall core disclosed in copending U.S. Patent application Ser. No. 877,632, Serriform Strip Crosstie Memory, L. J. Schwee, H. R. Irons, and W. E. Anderson, Navy Case No. 62,713, are incompatible to multilayered detection devices dependent upon ferromagnetic resonance phenomena.

A recent issue, U.S. Pat. No. 4,100,609, discloses a single layer magnetoresistance circuit for detecting the presence or absence of Bloch line-crosstie pairs at selected locations along a crosstie memory strip. The device taught there depends upon an electrical current flowing diagonally across the thin film layer through a central electrode spaced between a pair of electrodes adjoining one or both of the margins. That structure inherently confines the detector to the area between the pair of electrodes.

SUMMARY OF THE INVENTION

The present invention electrically incorporates an information bearing medium such as a crosstie memory strip of permalloy in which Bloch line—crosstie pairs are stored and propagated as binary bits, to complement an overlaid open gold detector circuit that utilizes the magnetoresistance of the strip to non-destructively sense information present in the underlying area of the strip (i.e., in the "detector area"). Facing edges of the detector circuit bounding the open segment are conformally oriented so that the path of least resistance for a detection current flowing through the intervening permalloy defines an angle, preferably of forty-five degrees, with the direction of propagation of the binary information. Detection current flowing through the overlaid sections of the circuit creates a magnetic field that drives Bloch lines along the domain wall of the strip. In crosstie memory strips with serriform margins, the margins along the detector area are made with a lesser depth of serration (i.e., a wider "neck"). Consequently, binary bits entering the detector area travel farther before coming to rest and may thus be said to be linearly stretched across the length of the detector area both because the impetus of propagation of Bloch lines provided by the magnetic field of the detection current and because the lesser depth of serration reduces the resistance to travel of Bloch lines. Extension of the detector area over a greater length of the strip by making the overlaid section of the detector circuit with a plurality of open segments, and, in a serriform crosstie memory strip, by arranging one serration in correspondence with each open segment, increases the variance of resistance in the detector circuit, thereby increasing the change of amplitude between logical "zero" and a "one" signals in the detector circuit. The thin magnetic film strip may be either anisotropic or isotropic.

Accordingly, it is an object of this invention to provide a fast, non-volitile device for detecting binary information at a selected location on a thin magnetic film strip.

It is another object to provide a device for linearly stretching binary bits of information over selected areas of a thin magnetic film strip.

It is still another object to provide a device for increasing the difference between a logical zero and a logical one signal in a magnetoresistance detector circuit.

It is also an object of the present invention to provide a thin film memory employing an integrated detector circuit for distinguishing between selected magnetic field patterns on the surface of the film.

BRIEF DESCRIPTION OF THE DRAWINGS

A more complete appreciation of this invention, and many of the attendant advantages thereof, will be readily enjoyed as the same becomes better understood by reference to the following detailed description when considered in conjunction with the accompanying drawings in which like numbers indicate the same or similar components, wherein:

FIG. 6A shows a section of a domain wall with three crosstie—Bloch line pairs along a prior art thin magnetic film.

FIG. 6B shows the section of domain wall set forth in FIG. 6A subsequent to the application of a one nanosecond magnetic field pulse.

FIG. 7 shows a top view of a section of a dentate thin magnetic film strip.

FIG. 8A shows an enlargement of a sectionalized segment of a dentate thin magnetic film.

FIG. 8B shows a variation of the margin denticulation shown in FIG. 8A.

DETAILED DESCRIPTION OF THE INVENTION

A domain wall is a boundary between domains in which magnetization occurs in different directions. In ferromagnetic materials, the neighboring magnetic-moments vectors are tightly coupled to form a large net magnetization vector M, which in many situations can be considered uniform over the sample. The direction of magnetization vector M is controlled by the induced anisotropy. In a sample of ferromagnetic material of finite dimension (e.g., a film strip of a uniform 320 Å thickness and having a width sufficient to accommodate the length of a crosstie — 10 to 30 microns) the influence of the edges of the sample upon the alignment of the magnetic moment vectors overwhelms the induced anisotropy causing the direction of the vectors to gradually seek alignment in opposite directions across the width of the sample after application of a magnetic pulse parallel to the width of the sample of sufficient magnitude to cause a nearly equal orientation of the vectors, thereby creating two domains, each domain having an oppositely directed net magnetization vector. The width of the sample required for the orientation of the individual magnetization to differ by 180° is referred to as a "domain wall" and marks the separation between the adjacent, but differently direced domains. At the center or core of the domain wall the individual vectors are oriented in either direction parallel to the width of the sample.

Domain walls have widths ranging from about 200 Å to 20,000 Å, depending upon the type of material and its thickness. There are three types of domain walls occurring in thin permalloy films: the Bloch wall that predominates in bulk materials with 1,000 Å or more of thickness, the unipolar Neel wall found in very thin films of approximately 100 Å thickness, and the crosstie wall. The crosstie wall is stable in magnetic materials of intermediate thickness, and has oppositely oriented sections of Neel walls bounded on one side by a Bloch line and on the other side by a crosstie. As Bloch line and crossties can be predictably nucleated and propelled by application of magnetic fields of measureable amplitude, duration, and direction, the domain wall of a thin magnetic film is particularly adaptable for use as a serially accessible memory such as a shift registry.

The crosstie memory taught herein is suitable for use as a disk or drum memory replacement, or a block oriented random access memory, or as a silicon integrated component of a microprocessor. The basic building blocks essential to each of these devices are the thin magnetic film strips serving as shift registers. The crosstie memory stores information in the domain walls of the film strip shift registers rather than in the magnetic domains, and utilizes the amenability of Bloch lines to nucelation and propagation in response to application of distinctive magnetic fields, to represent that information.

Figure 1:
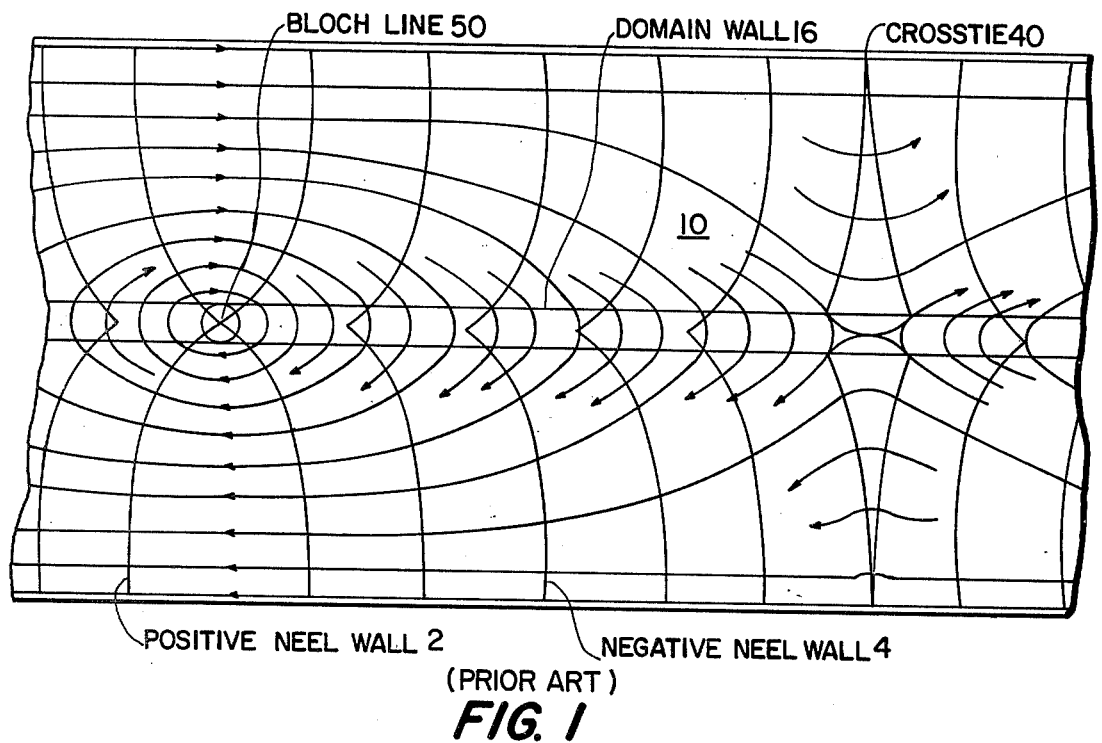
FIG. 1 shows an quantitative representation of a crosstie wall on a prior art thin magnetic film.

Referring now to the drawings, and in particular to FIG. 1 where a qualitative description of a crosstie wall superimposed upon a section of a prior art thin-film strip 10 is shown. A section of unipolar Neel wall 2 is separated by a Bloch line 50 from a short section of reversed polarity Neel wall 4. In a Neel wall the magnetization rotates about an axis (i.e., a Bloch line) perpendicular to the plane of the thin-film. The magnetization at the center on core 1 of the wall is in the plane of the surface of the film and can be either up (e.g., a positive Neel wall) or down (e.g., a negative Neel wall). A decrease in the magnetostatic energy of the wall will result when wall segments with opposite magnetization directions alternate along a Neel wall and flux closure occurs between the segments through the adjacent domains. Flux closure occurs only in a direction parallel to the direction of magnetization and short walls, known as crossties 40, positioned perpendicular to the domain wall core 1 are necessary to separate the regions in which flux closure occurs. The length of crosstie 40 approximately equals the width of the Neel wall 4. Much of the flux closes on itself around the Bloch line 50 indicating a circulation or curl. In general, a circulation in a uniform field gives rise to a force. For example, the flux about a current carrying wire in a uniform field creates a force on the wire normal to the directions of the uniform field and the length of the wire. Upon application of a positive or upwardly directed uniform or drive field normal to the easy axis of thin-film strip 10, the Bloch line 50 will move to the left along the domain wall 16 until it approaches another crosstie (not shown). The crosstie 40 will not move unless a field of greater magnitude is applied to thin film 10. If the magnitude of the drive field is increased, the Bloch line 50 and its neighboring crosstie will merge (i.e., annihilation) to produce a unipolar Neel wall. It is in part this propagation and annihilation feature of thin magnetic films that provides their utility as logic devices.

The crosstie differs from the Bloch line in that a coercive force of approximately 0.1 Oe. is required to move the Bloch line while a coercive force of approximately 3.0 Oe. is required to move a crosstie along the domain wall. The dimensions of FIG. 1 correspond to those of the total width of a Neel wall in a 25 micron wide section of thin permalloy film with the anisotropy field $H_k$ approximately equal to 4.0 Oe. The crosstie length equals the Neel wall width. Just as the area occupied by adjacent magnetic domains is large in comparison to that occupied by their common domain wall boundary, the region occupied by Neel walls is large in comparison to that occupied by a Bloch line—crosstie pair. A maximum of approximately 8,000 crossties per inch or 3,000 per centimeter normally occur in a thin permalloy film with $H_k$ equal to 4.0 Oe. This maximum is doubled when the anisotropy field $H_k$ is increased to 16.0 Oe. Unless otherwise stated, for the illustrative purposes of this detailed discussion only the properties of thin permalloy films with $H_k$ approximately equal to 4.0 Oe. will be discussed.

Figure 2:
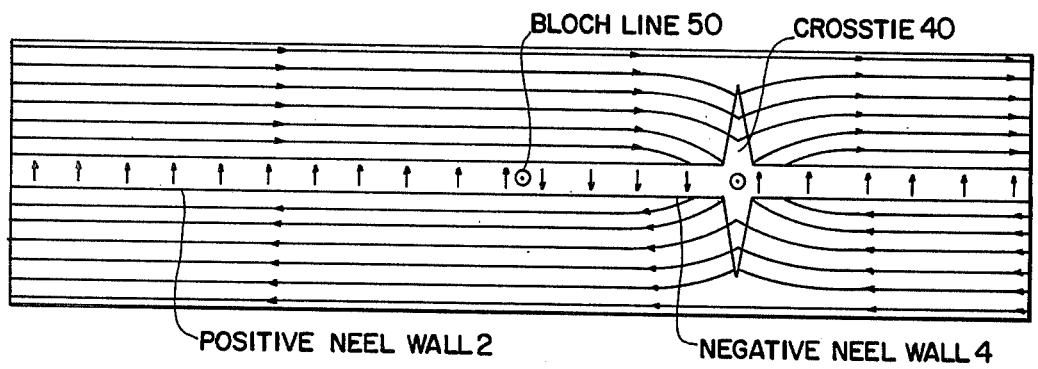
FIG. 2 shows a top view of an idealized representation of a crosstie wall on a prior art thin magnetic film.

FIG. 2 sets forth an idealized representation of an example of a section of a prior art thin magnetic film shift register 10. The crosstie domain wall core 1 may be considered to be adjacent Neel wall sections of opposite polarity. As a domain wall is considered to be a boundary between domains, a crosstie 40 and Bloch line 50 pair may be considered to be boundaries between Neel walls 2, 4 of opposite polarity. It is helpful to think of crosstie and Bloch line pairs as forming inner boundaries within the boundary formed by domain wall 16 between the adjoining magnetic domains as their behavior is analogous to the behavior of domain walls with respect to magnetic domains. In the sections of thin-film strips shown in FIGS. 1 and 2 the domain wall occupies substantially the width of the strip.

Figure 3:
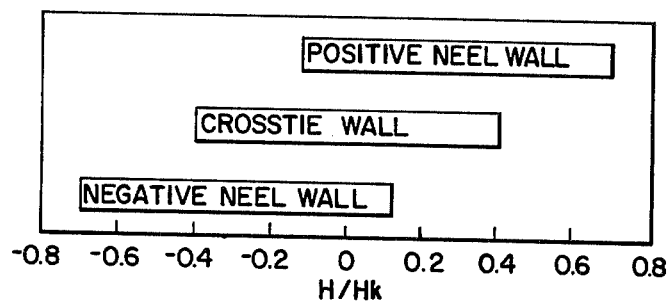
FIG. 3 is a bar graph illustrating the static stability condition of domain walls for a thin permalloy film of 400 Å thickness.

Referring now to the bar graph of FIG. 3, ranges of stability are shown for Neel and crosstie walls in a typical thin mangetic film strip, here a permalloy film of 400 Å thickness. The overlapping rectangles represent ranges of drive field H over which the denominated types of domain walls are stable as a function of the field $H_k$ first applied along the hard axis of the film strip. For example, if a drive field of $-0.6\ H_k$ is applied to a thin magnetic film strip, its domain wall must be a negative Neel wall and will remain a negative Neel wall as long as the magnitude of the applied drive field is between $-0.7\ H_k$ and $0.12\ H_k$. If a drive field large than $0.12\ H_k$ is then applied, crossties will be nucleated and a crosstie wall stable during application of drive fields with magnitudes between $-0.4\ H_k$ and $+0.4\ H_k$ will result. To obtain a positive Neel wall, a drive field larger than $0.4\ H_k$ must be applied. At a thickness of 400 Å with no applied field, the domain wall may be either crosstie, positive Neel or negative Neel, depending upon the magnitude of the last field applied and the state of the film before the application of that field.

Figure 4:
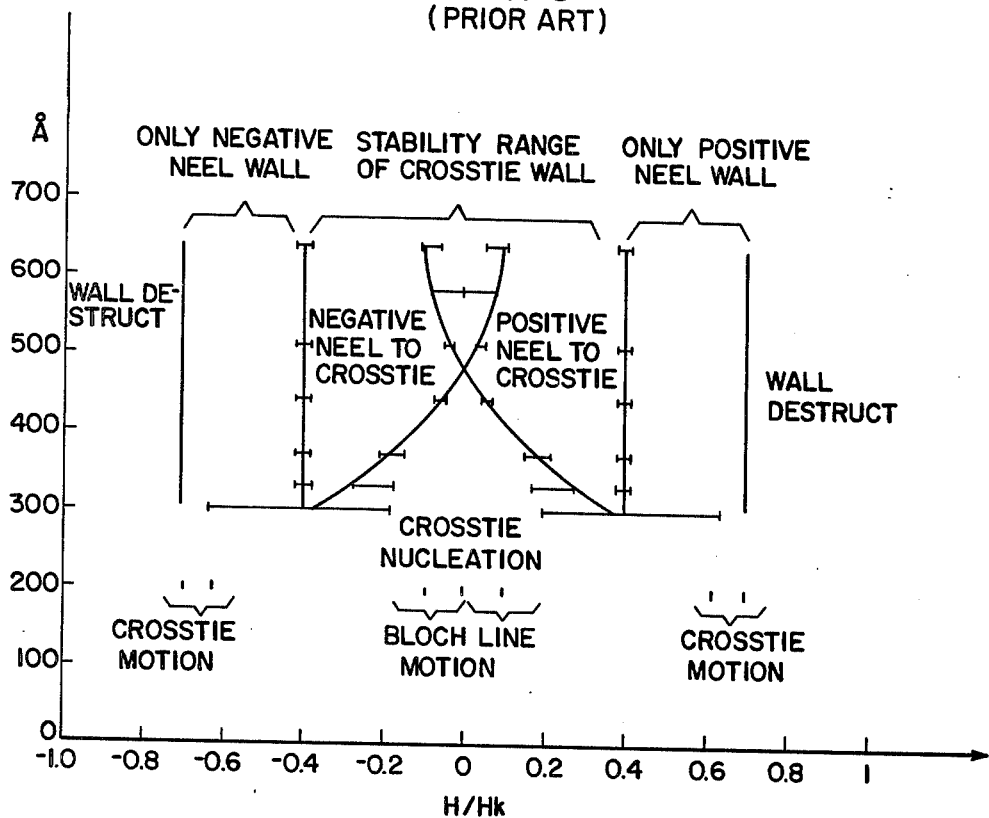
FIG. 4 is a two coordinate graph illustrating the static stability conditions of domain walls as a function of the film thickness.

To study the stability of a domain wall as a function of film thickness, a strip of Permalloy thin-film varying in thickness from 200 Å to 600 Å along its three inch length was studied. Stability conditions for Neel and crosstie walls as a function of film thickness are set forth in the graph of FIG. 4. The anisotropy field $H_k$ of the film strip varied from 4 Oe. at 400 Å to 4.8 Oe at 640 Å. In the graph of FIG. 4 the field applied along the hard axis of the film strip is normalized to $H_k$. The values shown in FIG. 3 compare to those shown in FIG. 4 for a film having a 400 Å thickness. As indicated the stability range of a crosstie is independent of film thickness. Between 300 Å and 640 Å little variation in the magnitude of the applied field is necessary to cause domain wall destruction.

Above 480 Å of thickness, crossties are always present at a zero applied field. Below 400 Å of thickness, it is possible for a Neel wall to be inverted by the motion of a Bloch line that has been generated at an edge of the film or at a defect. Below 400 Å of thickness Bloch line motion along the domain wall makes detection of the nucleation of crossties difficult. The difficulty of detection may be illustrated by applying a field with a magnitude that is gradually increased from a negative to a positive value to a film strip with a negative Neel wall. At approximately $0.05\ H_k$ several Neel walls reverse polarity by Bloch line motion. Although crosstie nucleation occurs concurrently with Bloch line generation, in the $0.05\ H_k$ field region reversal of Neel wall polarity by Bloch line motion is favored. As soon as a crosstie and a Bloch line pair is generated, the Bloch line will move to a location along the domain wall near to its neighboring crosstie. This Bloch line motion between crossties can be observed. Accordingly, only at those Neel walls where polarity reversal did not occur as the applied field approached $0.05\ H_k$ can the nucleation of crossties occur.

Figure 5:
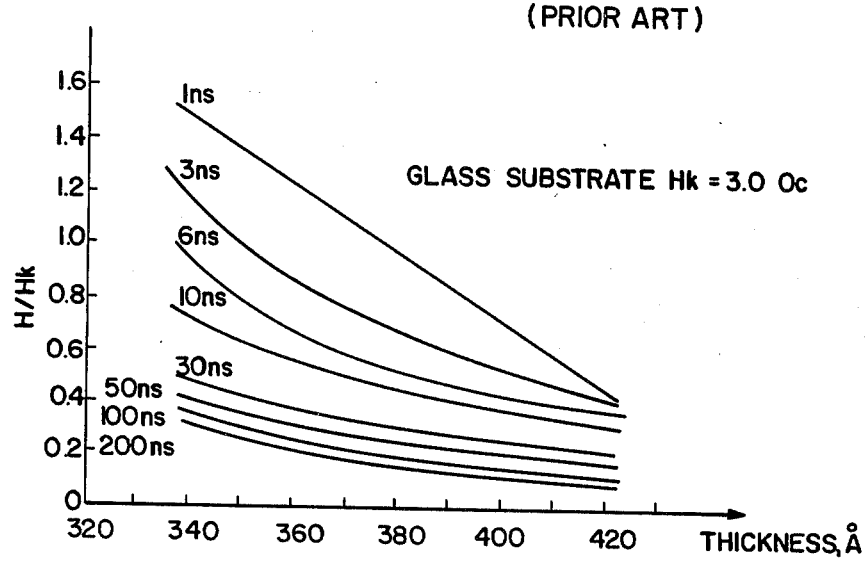
FIG. 5 is a two coordinate graph illustrating the amplitude of pulsed magnetic fields required to nucleate crossties as a function of film thickness.

Referring now to FIG. 5, the amplitudes of various durations of pulses magnetic fields required for nucleation of crossties is plotted as a function of the thickness of the film strip. The magnitude of the magnetic field required to generate crossties is inversely proportional to the duration of the pulse. In a film strip approximately 300 Å thick it is easy to generate periodic crossties about four microns apart if pulsed magnetic fields of one to five nanoseconds are used. Measurement of these values may be best made using a magneto-optic technique. A Bloch line has a mobility of approximately 48,000 centimeters per Oersted-second in the absence of a Bitter solution. If an excessively thich Bitter solution is used there is a likelihood of measurement error as the Bloch line will move slower at the lower field strengths due to its tendency to drag the Bitter solution with it. Additionally, the Bitter solution is inherently slow in its response to an applied pulse and often has a field associated with it of sufficient magnitude to return the Bloch line to its original position once the fast magnetic pulse has ceased. Annihilation of a crosstie—Bloch line pair occurs if the magnetic pulse is of sufficient amplitude and duration to move a Bloch line to the location of its neighboring crosstie. Application of a seven nanosecond pulse of 3.0 Oersteds in amplitude is sufficient in view of the approximately 48,000 centimeter per Oersted-second Bloch line mobility, to cause annihilation of all crossties periodically spaced four to five microns apart.

FIG. 6A sets forth an idealized representation of a section of a straight thin-film strip 10 having a domain wall core 1 with three crosstie—Bloch pairs 40-50, 42-52, 44-54. The positive Neel walls 20, 22, 24 are represented by 90 degree vectors while the negative Neel walls 21, 23, 25 are represented by 270 degree vectors. FIG. 6B is an idealized representation of a section of the thin-film strip 10 set forth in FIG. 6A immediately after application of a one nanosecond positive magnetic pulse to each of each of the Neel walls 20, 21, 22, 23, 24 and 25. The positive Neel walls, 20, 22, 24 retain their polarity and location despite application of the one nanosecond pulse. The application of the positive pulse to negative Neel walls 21, 23, 25 however, precipitates nucleation of periodic crosstie—Bloch line pairs 40a-50a, 42a-52a, 44a-54a. The Bloch lines 50, 50a, 52, 52a, 54, 54a represent a circulation or curl of the magnetic flux lines in the plane of the permalloy strip 10 and naturally seek positions along the domain wall of strip 10 that provide the least flux density. The crossties 40a, 40, 42a, 42, 44a, 44 represent the separation or boundary between adjacent Neel wall regions of opposite polarity. A Bloch line is naturally repelled by a crosstie. In a zero applied magnetic field a Bloch line will move about fifteen to twenty-five microns from the nearest crosstie. If a one nanosecond pulse creates a new Bloch line-crosstie pair between an existing Bloch line-crosstie pair, the existing Bloch line will be repelled by the new crosstie to a position along the domain wall, approximately fifteen microns distant from the new crosstie.

THE SERRATED STRIP

To reliably employ domain walls as shift register tracks, it is necessary to be able to position the walls in a readily ascertainable location in order that a sensor for measuring the voltage at the core of the wall may be accurately positioned over the core. Refer now to FIG. 7, where an idealized representation of an enlarged top view of a section of the surface of a thin permalloy film strip 11 is shown. The oblongly dentate strip 11 is fabricated so that its greatest surface dimension, its length, is parallel to the oblong axis, which here is also the easy axis of the film. The edges of strip 11 are defined by two parallel serriform margins 100, 101 symmetric about and each parallel to an oblong axis of the film, that is centered on the length of strip 11. One or more of these serriform strips 11 may be made by etching a permalloy film that is between 300 Å and 450 Å thick.

The denticulation of each margin 100, 101, a series of evenly spaced, substantially uniform, abutting denticles 70–87, is aligned parallel with the length of strip 11 and thus, with the easy axis of the thin film. For reasons hereinafter set forth, the denticulation of the margins 100, 101 has a mirror image symmetry about the oblong axis of the film and is uniformly asymmetric about an axis, such as the traverse axis, that is coplanar with the surface of the film and normal to the elongation of the strip. The core 1 of domain wall 16 forms approximately at the center of film strip 11 and is parallel to the oblong axis after application of an initial magnetic field in excess of the anisotropy field $H_k$ of the film strip of approximately 20 Oersteds along the traverse axis of the film. Domain wall 16 occupies substantially the entire width of strip 11. After application of the initial field to a film with a thickness between 300 Å and 450 Å, application of a one nanosecond magnetic pulse along the opposite hard axis nucleates crossties 40, 40$a$, 40$b$, 42, 44$a$, 44 which form between opposite indents 80–81, 82–83, 84–85 of the denticulation. The accompanying Bloch lines 50, 50$a$, 50$b$, 52, 54, 54$a$ seek those locations along the domain wall between pairs of opposite indents of the denticulation where the cross section of the part of thin film strip 11 normal to the domain wall 16 is greatest. These locations may be thought of as potential wells for Bloch lines as they allow for the greatest dispersion of the flux lines surrounding a Bloch line and thus, the least flux density.

Referring now to FIGS. 8A and 8B, wherein FIG. 8A, an enlargement of the denticulation of margins 100, 101 of a sectionalized segment of a thin-film strip 11 as set forth in FIG. 7, shows a pair of denticles 70, 71 situated on diametrically opposed sides of any oblong axis of the thin film that is centered along the length of strip 11. FIG. 8B shows a sectionalized segment of a thin-film strip 11 with a runcinate variation of the denticulation set forth in FIG. 8A. Any of those points 80, 81, 82, 83 along the edges of margins 100, 101 that are set in and are therefore closer than any of their respective neighboring points to a centerline running along the length of strip 11 may be referred to as an "indent". Any opposite pair of indents 80–81, 82–83 may be referred to as a "neck" of film strip 11. That point 90, 91 along the edge of margins 100, 101 between sequential indents 80, 82 and 81, 83 respectively, which is most distant from a centerline running along the length of strip 11 may be referred to as an "apex". The denticles 70–86, and 71–85 in each margin 100, 101 respectively, of film strip 11 as set forth in FIG. 7, are arranged in an abutting sequence with the orientation of all denticles in the same margin being substantially similar in relation to both the easy and hard axes of the film. Accordingly, the denticulation of each serriform margin 100,101 is etched so that a straight line just touching either the apex 90, 92, 94 or 91, 93, 95 of each denticle in a margin 100, 101 respectively, or the indents 80, 82, 84 or 81, 83, 85 formed between abutting denticles in a margin 100,101 respectively is parallel to the elongation of the strip 11, and therefore, to the oblong or easy axis of the film. In order to assure the formation of a domain wall (not shown) in response to application of the initial magnetic pulse along the traverse or hard axis, the denticulation of both margins 100,101 is oriented in the same direction along an oblong axis and is typically polyjugate in that any denticle 70 along one serriform margin 100 has an opposite or paired denticle 71 in the other oblong margin 101 so that the denticulation of the strip 11 is asymmetric about an axis such as the traverse axis that is coplanar with but normal to the oblong axis of the film. Predictable location and propagation of crossties and Bloch lines requires the denticulation of opposite margins 100, 101 to be approximately symmetric about an oblong axis of the film centered along the elongation of the strip 11. Each pair of opposite or bijugate denticles 70, 71 may be thought of as a distinct memory cell for the storage of binary information.

The denticles forming the serriform margins 100, 101 are, within the limits set by the present state of the art of etching thin magnetic films, nearly identical in shape, surface area, thickness, and magnetic characteristics. Accordingly, any one denticle such as one of the opposite denticles 70, 71, and its characteristics and properties, as set forth in a critical discussion herein is exemplary of any other dentiform or serriform aspect of a thin magnetic film strip constructed in accordance with the present teachings.

Denticle 70 is geometrically described by a major side 82–90 and a minor side 90–80 which intersect at apex 90, and a base 80–82. The base determines the serration length. The opposite denticle 71 is described by a major side 83–91 and a minor side 91–81 which intersect at apex 91, and a base 81–83. Bases 80–82 and 81–83 run between sequential indents, 80, 82 and 81, 83 respectively, and lie approximately parallel to the elongation of strip 11 and thus, to the oblong and the easy axes of the film. Projection of a chord running between indent 82 and apex 90 upon the traverse or hard axis of the film will, if base 80–82 is parallel to the oblong axis of the film, equal the projection upon the traverse axis of the film of a chord drawn between apex 90 and indent 80:

$$\text{CHORD}(82\text{-}90)\cdot \text{Sine } \theta \simeq \text{CHORD}(90\text{-}80)\cdot \text{Sine } \phi \quad (1)$$

where,
$\theta = \angle(80\text{-}82\text{-}90)$,
$\phi = \angle(90\text{-}80\text{-}82)$.
This equation also holds true in denticle 71 for chords drawn between indent 83 and apex 91, and apex 91 and indent 81.

While no external field is applied the magnetization in the permalloy film strip 11 may point either to the left parallel to one of the oblong axis directions, or to the right parallel to the opposite oblong axis direction. When a pulsed magnetic field is applied to a film strip 11 in the direction of the traverse axis, normal to the oblong axis, the magnetization of that strip rotates toward alignment with the traverse axis. If the pulse field is small, the magnetization turns only through a very small angle and relaxes by returning to its initial oblong direction after the field ceases. If a field of magnitude greater than the anisotropy field $H_k$ of the film strip 11 is applied along the traverse axis of the strip, the magnetization rotates fully to the traverse direction, forming magnetic poles at the surfaces and edges of the film strip as indicated by the dashed vectors in denticles 70, 71. When that field is reduced or withdrawn, the magnetization becomes unstable and relaxes by rotating toward the oblong axis of the strip. As the magnetization of permalloy films lies parallel to the surfaces and edges when in its lowest energy state (i.e., in the absence of an applied magnetic field), the magnetization along the edges of denticles 70, 71 relaxes by seeking an alignment parallel to the nearest edge and rotates in the direction requiring the least angular change to achieve an orientation most parallel to the nearest edge. Accordingly, after application of the magnetic field along the upward traverse axis, magnetization closest to the major edge 82-90 of denticle 70 rotates counterclockwise from its traverse axis alignment to a parallel alignment with edge 82-90, these alignments being indicated by the dashed and solid vectors respectively, nearest to edge 82-90. Similarly, the magnetization closest to major edge 83-91 of denticle 71 rotates clockwise from its hard axis alignment to an alignment parallel with edge 83-91 as indicated by the dashed and solid vectors respectively, nearest to edge 83-91. In FIG. 8A the magnetization closest to minor edge 90-80 of denticle 70 relaxes by rotating clockwise from its hard axis alignment to an alignment parallel with the edge 90-80 as indicated by the dashed and solid vectors respectively, nearest to edge 90-80; while the magnetization closest to minor edge 91-81 of denticle 71 relaxes by rotating counterclockwise from its hard axis alignment to an alignment parallel with the edge 91-81 as indicated by the dashed and solid vectors respectively, nearest to edge 91-81. In FIG. 8B the minor edges 90-80, 91-81 of denticles 70, 71 respectively, have chords with a slope with respect to the oblong and traverse axis of the film having the same sign as the slope of the chords of the corresponding major edges 82-90, 83-91 respectively. Therefore, in FIG. 8B the magnetization closest to minor edge 90-80 of denticle 70 relaxes by rotating counterclockwise from its traverse axis alignment to an alignment parallel with edge 90-80 as indicated by the dashed and solid vectors respectively, nearest to edge 90-80; while the magnetization closest to minor edge 91-81 of denticle 71 relaxes by rotating clockwise from its traverse axis alignment to an alignment parallel with edge 91-81 as indicated by the dashed and solid vectors respectively, nearest to edge 91-81.

The propensity of the local magnetization to relax from a traverse axis orientation by rotating towards an alignment with the nearest edge creates upon the neighboring units of magnetization one of two opposite torques. In denticle 70 one torque predominates in that area between edge 80-90 and the projection of edge 82-90 upon base 80-82, while the opposite torque predominates in tha area between edge 80-90 and the projection of edge 80-90 upon base 80-82. The direction of the net macroscopic magnetization in each denticle 70 is dependent upon the relative magnitudes of the oppositely directed torque. As each torque is proportional to the product of the length of the chord bounding its area of predominance and the sine of twice the included angle, the net torque T is proportional to:

$$T \propto A \sin 2\theta - B \sin 2\phi \quad (2)$$

where,
A = chord (82-90)
B = chord (80-90)
$\theta = \angle(80-82-90)$
$\phi = \angle(82-80-90)$.

It is essential to the creation of a domain wall (not shown), regardless of whether base (80-82) is approximately parallel to the oblong axis of the thin-film strip, that:

$$A \sin 2\theta > B \sin 2\phi. \quad (3)$$

This inequality must also hold true for the projection on the oblong axis of the chords of denticle 71. While it is essential that this inequality hold true for all of the denticles of a serriform strip 11, it should be understood that the present teachings require neither that the length of a major chord 82-90, 83-91 exceed the length of the minor chord 90-80, 91-81 with which it intersects at an apex 90, 91, nor that the sign of the slope of intersecting major and minor chords differ with respect to the oblong and traverse axes, nor that the sign of the slope of opposite chords differ with respect to the oblong and traverse axis, nor that any side 82-90, 90-80, 83-91, 91-81 be a straight line, nor that any base 80-82, 81-83 be parallel to the oblong axis of the film.

In view of inequality (3), the sum of the components of magnetization aligned with the right-to-left oblong axis in denticle 70 exceeds the sum of the components of magnetization aligned with the opposite easy axis; therefore, the oblong axis component of the net magnetization of denticle 70 is aligned with the oblong axis of the film in the right-to-left direction. Similarly, in denticle 71, relaxation of the magnetization results in an oblong axis component of the net magnetization aligned in the left-to-right direction. In FIG. 8B where in each denticle 70, 71 the signs of the slope of the chords describing its edges 80-90, 90-82, 81-91, 91-83 is the same, the oblong axis components of the net magnetization for each margin is greater in magnitude than the corresponding oblong axis component of margins 100, 101 of FIG. 8A. The more distance between a point on the surface of the thin film and the nearest edge, the greater the angular variance between the orientation of magnetization at that point and magnetization at that nearest edge and the lesser the angular variance between the orientation of magnetization at that point and the oblong axis of the film. Exchange coupling between crystallites of the film causes the orientation of magnetization of neighboring crystallites to be nearly parallel, thereby extending the alignment of magnetization in the predominant oblong axis direction across the bases 80-82, 81-83 of denticles 70, 71 and throughout the adjoining areas of margins 100, 101. The boundary between these oppositely directed oblong axis components of net magnetization fields in each margins is the domain wall 16 (not shown). Accordingly, it is apparent that for a thin magnetic film strip 11 having denticulated margins 100, 101 formed with parallel sequences of abutting denticles 70, 71 for which inequality (3) holds true, regardless of whether or not these margins are normally or eccentrically symmetric about the oblong axis of film, relaxation of the magnetization of the film after application of a magnetic field along one traverse axis of the film magnitude greater than the anisotropy field $H_k$ of the film results in the net macroscopic magnetization in each margin 100, 101 having its oblong axial component aligned along opposite oblong axes.

Figure 9:
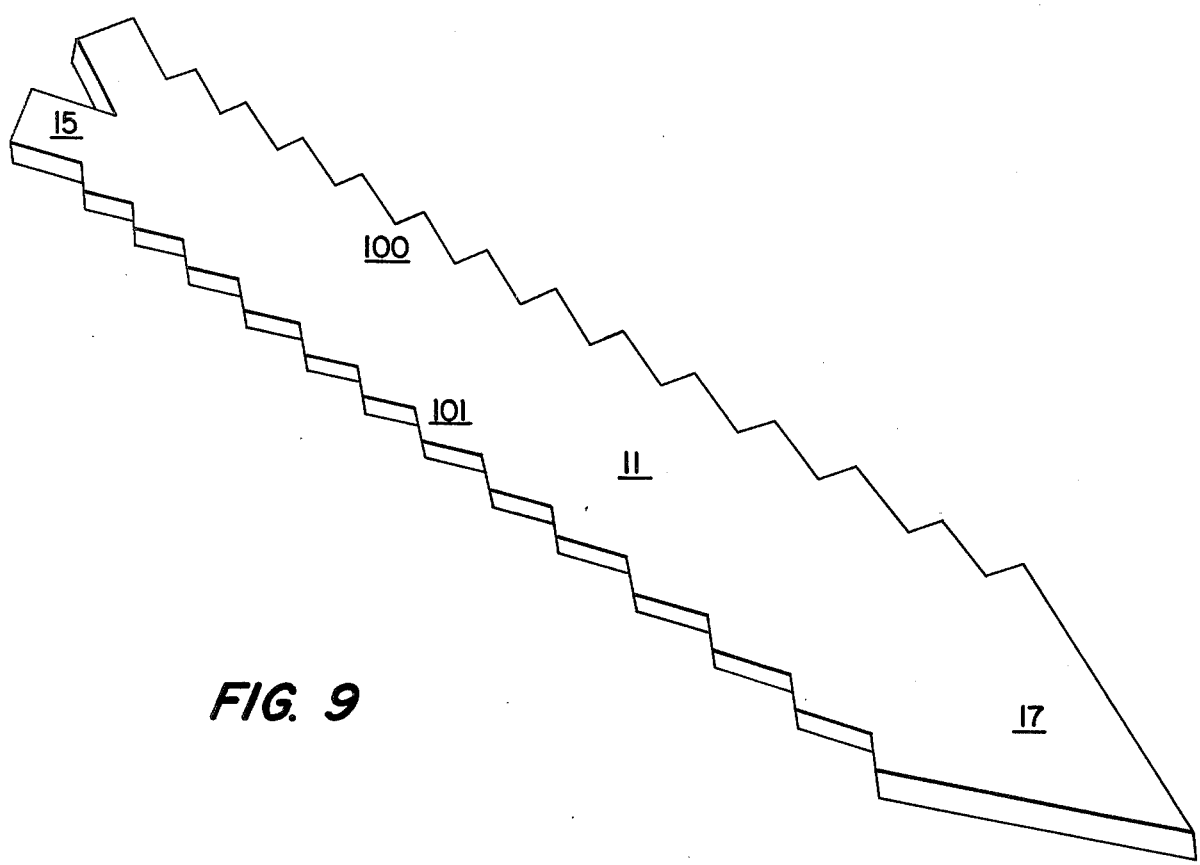
FIG. 9 is an axonometric projection of a serriform thin magnetic film strip, in its entirety.

Refer now to FIG. 9 where an axonometric projection of the surface of a thin magnetic film strip 11 with denticulated margins 100, 101 is shown in the entirety of its length. Oblong strip 11 terminates at one extremity with an aculeate prow 17 and at the other extremity with a homocercal tail 15. An acute intersection at the centerline aligned with an oblong axis of strip 11 of the edges of prow 17 and tail 15 effectively positions both end of domain wall core 1 at the centerline. An approximately equal distribution of surface area and therefore, an equality between the magnitudes of oppositely directed local easy or oblong axis magnetic fields in prow 17 and tail 15, confines the formation of the core of the domain wall to a readily ascertained location along the center of strip 11. Normal symmetry of parallel, denticulated margins 100, 101 similarly controls the location of the core section of the domain wall (not shown), thereby providing for its alignment with the extremities of the strip 11, thus providing a relatively straight domain wall core between the apex of prow 17 and the notch of tail 15.

Figures 10A, 10C:
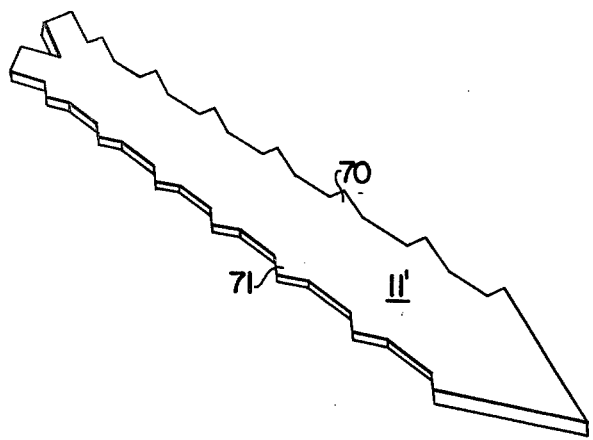
FIG. 10A shows an axonometric view of an alternative embodiment of a serriform thin-film strip memory.
FIG. 10C shows an axonometric view of an alternative embodiment of a serriform thin-film strip memory.
Figure 10B:
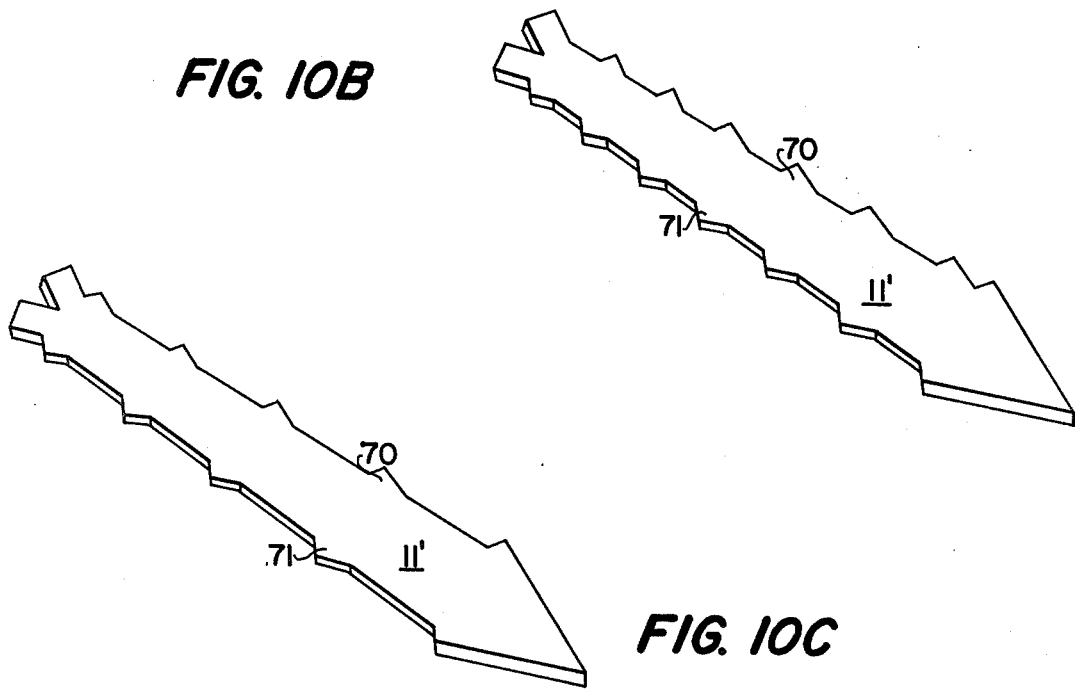
FIG. 10B shows an axonometric view of an alternative embodiment of a serriform thin-film strip memory.
Figure 10D:
FIG. 10D shows an axonometric view of an alternative embodiment of a serriform thin-film strip memory.

The serriform thin-film strip discussed in detail in the foregoing paragraphs is generally described as having incised serrate margins running parallel to its oblong axis with the margins formed by abutting jugate denticles, as is illustrated by FIG. 9 of the drawings. It should be apparent that in practicing the present invention however, that three considerations influence the fabrication of a thin-film strip according to the foregoing teachings. The geometric conformity of each denticle to inequality (3) assures a predictable edge effect upon the local magnetization. The near identity of the direction of orientation of all denticles in both oblong margins permits cooperative addition of edge effects local to each denticle resulting in formation of a single domain wall extending the length of the strip. The spaced denticulation of individual denticles along each margin in respect to the directly and obliquely opposite denticles of the parallel margin controls the accurate location of the core of the domain wall along the oblong axis or centerline of the strip. Accordingly, a thin-film crosstie memory strip having margins formed of a plurality of similarly oriented denticles geometrically conforming to inequality (3) may have a precisely positioned domain wall core even though the denticles in each margin are not abutting or the denticles in opposite margins are not jugate. Referring to FIG. 10A of the drawings a serriform thin-film strip 11' is shown having non-abutting, jugate denticles. Along each margin each denticle 70, 71 is spaced apart from its adjacent denticles by a length equal to the length of its base. FIG. 10B of the drawings shows a serriform thinfilm strip 11' having non-abutting denticles arranged along opposite edges of the strip in an alternate or non-jugate sequence. As in the strip shown in FIG. 10A, each denticle 70, 71 is spaced from its adjacent denticles by a length equal to the length of its base. Thus, in the strips shown in FIGS. 10A and 10B if each denticle has a 10 micron baselength, the apices of adjacent denticles along each margin will be 20 microns apart. In FIG. 10C of the drawings, serriform thin-film strip 11 has serriform oblong margins formed with non-abutting, jugate denticles spaced apart from adjacent denticles by a length equal to two base lengths. FIG. 10D of the drawings shows a thin-film strip 11' having serriform oblong margins formed with non-abutting denticles arranged in an alternate or non-jugate (i.e., staggered) sequence. Each denticle is spaced apart from adjacent denticles in the same marging by a length equal to twice the length of its base. Thus, in the thin-film strips shown in FIGS. 10C and 10D if each denticle has a 10 micron baselength, the apices of adjacent denticles will by 30 microns apart. The spacing of non-abutting denticles is ordered rather than random, in correspondece with the accompanying propagation and detection scheme.

The serrated margins simplify production of the thin permalloy strips by permitting the use of conventional mask aligners. A fresh film of polycrystalline nickel-iron is prepared under vacuum on a glass or silicon dioxide substrate in the presence of a uniform magnetic field. An easy axis for the magnetization arises from the magnetic field during deposition and is normally chosen parallel to the longest side of the element. The crystalline size is on the order of the film thickness. These crystallites are face-centered cubic, exhibit a certain crystalline anisotropy, and are tightly coupled by exchange coupling and magnetostatic coupling. Fresh films are susceptible to scratching. After several hours of exposure to air the films become quite scratch resistant, presumably due to an oxide formation. The mechanical integrity of the films is good and introduces little constraint upon microelectronic assembly procedures except that of adequately aging the film surface. The oxide layer appears to lessen the vulnerability of the film to various chemicals. Fresh films are vulnerable to a variety of aqueous solutions while aged films are more durable. Chemical constraints upon a microelectronic assembly are numerous in order to preserve the film's surface, its bulk, and the supporting material.

The equation which describes the magnetoresistance effect in permalloy films is given as:

$$R = R_0 + (\Delta R \cos 2\phi)/2, \quad (4)$$

where:

$$R_0 = R_\perp + R_{11}/2, \quad (5)$$

$$\Delta R = R_{11} - R_\perp, \quad (6)$$

and $\phi$ is the smaller angle between the current direction and the local magnetization vector. When the detector current is parallel to the magnetization vector, M, $R_{11}$ is measured; when the detector current is perpendicular to M, $R_\perp$ is measured. In permalloy films about 450 A thick, $R_{11}$ is two to three percent larger than $R_\perp$. It is shown in U.S. Pat. No. 4,100,609 that the rate of change of R with respect to $\phi$ is a maximum when $\phi$ equals forty-five degrees. A sensitive detector should therefore be configured with the current flowing at forty-five degrees with respect to the nominal magnetization direction.

Figure 11:
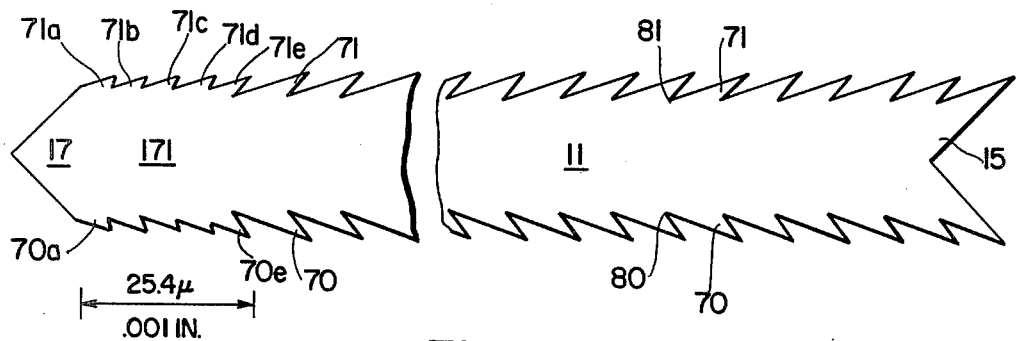
FIG. 11 shows a top view of a serriform thin-film memory strip with the detector area at one extreme.

Referring to FIG. 11, a top view shows a thin magnetic film strip 11 with opposite serriform margins formed by symmetric rows of denticles 70, 71. The detector area 171 is defined by opposite rows of denticles 70a-70e and 71a-71e made with less pronounced serration than denticles 70, 71. The serration length of denticles 70a-71e is slightly greater than one half of the eight micron serration length of denticles 70,71. The neck between opposite pairs of indents between denticles 70a-70e and 71a-71e is wider than the fifteen micron wide neck between indents 80, 81 in the body of film strip 11. The margins along the detector area 171 exert less restrictive force upon the travel of Bloch lines entering the detector area than do the margins 100,101 of more pronounced serration along the body of film strip 11. Consequently, a Bloch line in the detector area tends to influence the magnetization over a greater length in the detector area.

Figure 12:
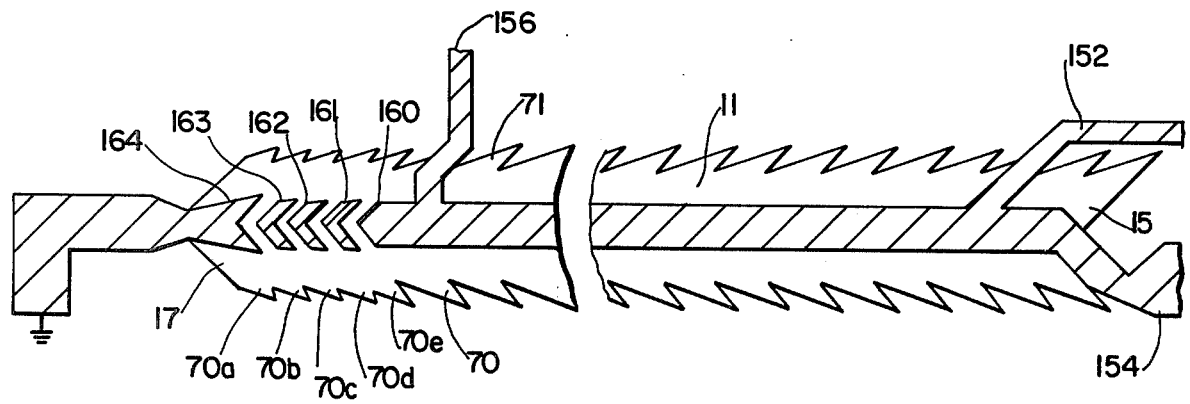
FIG. 12 shows a top view of a serriform thin-film memory strip of FIG. 11 and part of the overlaid detector circuit.

FIG. 12 shows a top view of part of a detector circuit overlaid upon the serriform thin magnetic film strip of FIG. 11. A single gold conductor 150 is deposited directly upon the surface and runs along the length of thin magnetic film strip 11. Conductor 150 divides into a nucleate lead 152 and a propagate lead 154 at the homocercal end 15 of the strip. A detector lead 156 joins conductor 150 just to the right of the detector area 171. Conductor 150 terminates at a point 160 just inside the detector area. A series of three regularly spaced apart gold islands 161, 162, 163 each in the shape of a chevron, is deposited upon the surface of the strip 11. The islands are symmetrically and regularly spaced between successive adjacent denticles 70b–71b, 70c–71c, and 70d–71d. A grounded conductor 164, centered upon the acutely aculeate tip 17 of strip 11, has homocercal edges parallel and spaced apart from the neighboring face of the outermost island 163. The facing edges of islands 161, 162, 163, as well as the facing edges of conductor 160 and island 161, and island 163 and grounded conductor 164 are parallel and obliquely oriented with respect to the longitudinal dimension of strip 11 in order that an electrical detection current entering conductor 150 via lead 156, when entering the permalloy film 11 in the detector area 171 at the edge of conductor 160, spreads out and flows at an angle of about forty-five degrees with the longitudinal dimension in order to reach the nearest point on the facing edge of island 161. As an electrical current tends to take the path of least resistance when flowing between the facing edges of gold conductors 160–164, and permalloy film 11 tends to be homogeneous in composition and resistivity, the edges of conductors 160, 164 and islands 161, 162, 163 are configured so that the shortest distance between any pair of facing edges defines an angle of either 135 degrees or 225 degrees with the longitudinal dimension of strip 11. This configuration assures that a detection current flowing through the permalloy film between facing edges flows either parallel or perpendicular to the magnetization of a Bloch line present in the detector area.

Figure 13A:
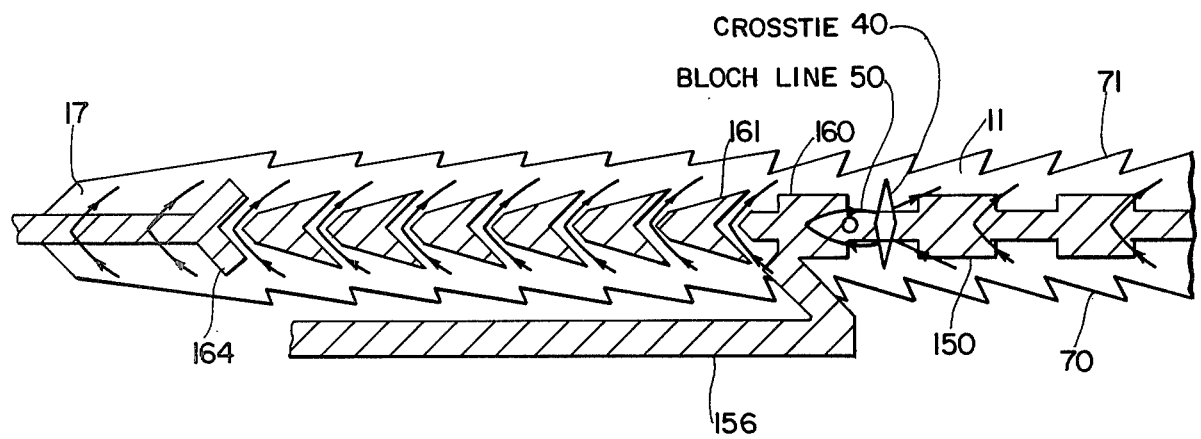
FIG. 13A shows a top view with magnetization vectors representing a positive Neel wall superimposed upon the memory strip and detector circuit of FIG. 12.
Figure 13B:
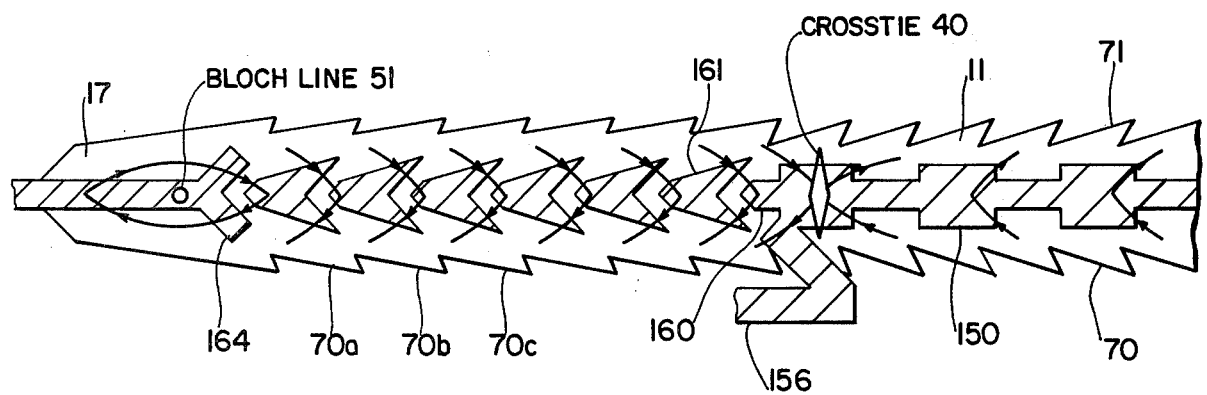
FIG. 13B shows a top view with magnetization vectors representing a negative Neel wall superimposed upon the memory strip and detector circuit of FIG. 12.

Turning now to FIGS. 13A and 13B, top views show the direction of magnetization vectors representing positive and negative Neel walls respectively, superimposed upon the structure of a detector area of a memory strip, principally between the open segments of the detector circuit. As electrical current from the detector circuit 161 enters the permalloy strip, the current spreads out and flows at an angle of about forty-five degrees into the next plated gold segment 161 where the current again becomes confined. The positive Neel wall represented in FIG. 13A corresponds to a logical "zero"; the detector current flowing through the permalloy strip 11 across the open segments 160–161, 161–162 . . . 163–164 is nearly perpendicular to the magnetization, so the resistance of the permalloy is lower. The negative Neel wall represented in FIG. 13B corresponds to a logical 37 one"; the detector current flowing through the permalloy strip 11 across the open segments 160–161, 161–162, . . . 163–164 is nearly parallel to the magnetization, so the resistance of the permalloy is higher. The change in resistance for each segment (n.b., one open segment occurs in correspondence with each serration length) is about 0.1 millivolt for a five milliampere current; the net signal for the detector is the product of the number of open segments and 0.1 millivolts. A bit stretching detector with ten segments that, due to a defective photomask, were poorly defined, gave a signal of 0.5 millivolts with a five milliampere detector current.

As the details of the foregoing discussion of figures clearly indicates, a bit of information represented by a single Bloch line–crosstie pair is linearly stretched in the detector area. Also, the current flowing through the gold islands 161–163 of the detector circuit creates a magnetic field that drives the Bloch line along the domain wall. A bit stretching step requires a longer period however, because the propagation current moving the Bloch line must persist until the Bloch line transverse the length of the detector area. Some compromise may be made between shift rate and detector signal amplitude if a signal larger than 0.1 millivolts is desired. The conformal facing edges between terminal sections 160, 161, 162, 163, 164 in the detector circuit of FIG. 12 are shown as being mating edges while the facing edges of the same sections in FIGS. 13A and 13B are shown as being conformal but imperfectly mating. In all instances the facing edges are symmetric about the longitudinal axis of thin-film strip 11. In view of these distinctions, it should be clear that in endeavoring to practice the instant invention one should design the open segments of detector circuit so that a line defining the shortest distance, and thus the path of least resistance through the intermediate volume of permalloy, between each point on a terminal edge and the facing terminal edge potentially intersects the longitudinal dimension of the thin-film strip at an oblique angle. Preferably, the oblique angle equals forty-five degrees.

Although described in conjunction with a straight, serriform crosstie memory strip, the bit stretcher detector circuit may be applied to a crosstie memory strip that has smooth margins. Additionally, if the thin-film is magnetically isotropic, the crosstie memory strip supporting the bit stretcher may be curved, serpentine, circular or spiral.

Other details about the bit stretcher detector and ancillary field determined propagation circuitry are disclosed in either a paper entitled "Approaches Toward Field Determined Propagation Of Crossties And Bloch Lines," written by L. J. Schwee, W. E. Anderson, Y. J. Liu and R. N. Lee, and printed in the Conference Proceedings, Journal of Applied Physics, volume 49, number 3, part II, in March, 1978, or in our copending application Ser. No. 958,751, filed on the 8th of November, 1978 concurrently with this application and entitled "Field Determined Propagation Circuit," both references being incorporated into this application.

What is claimed as new and desired to be protected by issue of a letters patent is:

1. A circuit for non-destructively detecting the presence and absence of binary information within an area of a shift register of the type suitable for storage and propagation of Bloch linecrosstie pairs, comprising:
a thin-film strip of magnetic material of uniform thickness exhibiting a continuous, stationary domain wall spaced between opposite oblong margins;
an electrical conductor of a substance characterized by a lower resistivity than the magnetic material, deposited upon one surface of the thin-film strip and spaced between the opposite oblong margins; and
the electrical conductor having an open segment formed by a terminal section having edges facing conformal edges of an adjacent terminal section, the edges of each terminal section being symmetrically arranged obliquely about the principal longitudinal axis of the thin-film strip.

2. The circuit set forth in claim 1 wherein the opposite oblong margins are serriform, each of the margins being formed by adjacent unidirectionally oriented denticles, further comprising:

denticles forming opposite oblong margins adjacent the electrical conductor having less pronounced serration than denticles elsewhere forming the opposite oblong margins.

3. The circuit set forth in claim 1 wherein the opposite oblong margins are serriform, each of the margins being formed by adjacent unidirectionally oriented denticles, further comprising:

denticles forming opposite oblong margins adjacent the terminal sections having a shorter serration length than denticles elsewhere forming the opposite oblong margins.

4. The circuit set forth in claim 1, further comprising: the electrical conductor having a single open segment.

5. The circuit set forth in claim 1, further comprising: the electrical conductor having a plurality of open segments spaced apart along the domain wall.

6. A circuit for non-destructively detecting the presence and absence of binary information represented by Bloch line-crosstie pairs, comprising:

a thin-film strip of magnetic material of uniform thickness having unidirectionally oriented denticulation along opposed oblong margins parallel to and symmetric about an oblong centerline;

an electrical conductor of a substance characterized by a lower resistivity than the magnetic material, deposited upon one surface of the thin-film strip and spaced between the opposed oblong margins;

the electrical conductor having a plurality of spaced-apart open segments formed by terminal sections of the conductor edges facing conformal edges of adjacent terminal sections, the edges of each terminal section being symmetrically arranged obliquely about the oblong centerline; and the denticulation along opposed oblong margins immediately adjacent the terminal sections having less pronounced serration than denticulation elsewhere along the opposed oblong margins.

* * * * *